United States Patent
Garman et al.

(10) Patent No.: US 9,545,040 B2
(45) Date of Patent: Jan. 10, 2017

(54) CABLE RETENTION HOUSING

(71) Applicants: Joshua A. Garman, Mount Holly Springs, PA (US); Charles M. Gross, York, PA (US)

(72) Inventors: Joshua A. Garman, Mount Holly Springs, PA (US); Charles M. Gross, York, PA (US)

(73) Assignee: FCI Americas Technology LLC, Carson City, NV (US)

( * ) Notice: Subject to any disclaimer, the term of this patent is extended or adjusted under 35 U.S.C. 154(b) by 376 days.

(21) Appl. No.: 13/732,816

(22) Filed: Jan. 2, 2013

(65) Prior Publication Data
US 2013/0188325 A1 Jul. 25, 2013

Related U.S. Application Data

(60) Provisional application No. 61/589,537, filed on Jan. 23, 2012.

(51) Int. Cl.
*H05K 9/00* (2006.01)
*H05K 5/00* (2006.01)
(Continued)

(52) U.S. Cl.
CPC ........ *H05K 9/0007* (2013.01); *H01R 13/6592* (2013.01); *H01R 13/6594* (2013.01);
(Continued)

(58) Field of Classification Search
CPC ................... H05K 2201/10356; H05K 9/0007; H01R 13/6599
(Continued)

(56) References Cited

U.S. PATENT DOCUMENTS 5,035,631 A 7/1991 Piorunneck et al.
5,085,596 A 2/1992 Bowen et al.
(Continued)

FOREIGN PATENT DOCUMENTS

JP 2002/170640 6/2002
JP 2011/028903 2/2011
(Continued)

OTHER PUBLICATIONS

International Patent Application No. PCT/US2013/022127: International Search Report dated Apr. 30, 2013, 9 pages.
U.S. Appl. No. 61/624,238, filed Apr. 13, 2012, Stoner.

*Primary Examiner* — Dion R Ferguson
*Assistant Examiner* — Mandeep S Buttar
(74) *Attorney, Agent, or Firm* — Wolf, Greenfield & Sacks, P.C.

(57) ABSTRACT

A retention housing having a housing body is provided, the retention housing configured to be mounted to a substrate. At least one, such as a plurality of cables can be electrically connected to a respective surface of the substrate to which the retention housing is mounted. When the retention housing is mounted to the respective surface of the substrate, at least a portion of the at least one cable can be compressed between a ground element supported by the respective surface of the substrate and a corresponding upper wall of the housing body, such that the at least one cable is placed into electrical communication with a ground plane defined by the substrate.

17 Claims, 10 Drawing Sheets

(51) Int. Cl.
   *H05K 13/00*      (2006.01)
   *H05K 1/02*       (2006.01)
   *H01R 13/6592*    (2011.01)
   *H01R 13/6594*    (2011.01)
   *H05K 1/11*       (2006.01)
   *H05K 3/34*       (2006.01)
   *H01R 12/53*      (2011.01)
   *H01R 13/6599*    (2011.01)

(52) U.S. Cl.
   CPC ......... *H05K 1/0216* (2013.01); *H05K 5/0004* (2013.01); *H05K 13/00* (2013.01); *H01R 12/53* (2013.01); *H01R 13/6599* (2013.01); *H05K 1/117* (2013.01); *H05K 3/34* (2013.01); *H05K 2201/10356* (2013.01); *Y10T 29/49124* (2015.01)

(58) Field of Classification Search
   USPC ............. 361/753; 174/50, 84 C, 72 TR
   See application file for complete search history.

(56) References Cited

U.S. PATENT DOCUMENTS

| | | | |
|---|---|---|---|
| 5,122,065 A | 6/1992 | Dudek et al. | |
| 5,658,170 A | 8/1997 | Tan et al. | |
| 5,770,818 A | 6/1998 | Tanaka et al. | |
| 5,944,536 A | 8/1999 | Seong et al. | |
| 5,953,815 A | 9/1999 | Kaminski et al. | |
| 5,980,321 A | 11/1999 | Cohen et al. | |
| 6,139,372 A | 10/2000 | Yang | |
| 6,224,430 B1 * | 5/2001 | Kusuda | H01R 12/515 439/709 |
| 6,575,772 B1 | 6/2003 | Soubh et al. | |
| 6,726,492 B1 * | 4/2004 | Yu | |
| 6,726,503 B2 | 4/2004 | Waddell et al. | |
| 6,802,744 B2 | 10/2004 | Chiang | |
| 6,893,272 B2 | 5/2005 | Yu | |
| 7,168,960 B1 | 1/2007 | Ju | |
| 7,364,474 B2 | 4/2008 | DeLessert et al. | |
| 7,435,132 B1 | 10/2008 | Fong et al. | |
| 7,497,736 B2 | 3/2009 | Minich et al. | |
| 7,510,425 B2 | 3/2009 | Kuo et al. | |
| 8,231,415 B2 | 7/2012 | Johnescu et al. | |
| 8,366,485 B2 | 2/2013 | Johnescu et al. | |
| 8,440,910 B2 * | 5/2013 | Nonen et al. | 174/115 |
| 2003/0040203 A1 * | 2/2003 | Kuroda et al. | 439/98 |
| 2003/0098173 A1 * | 5/2003 | Ide | H01B 7/0861 174/78 |
| 2003/0176085 A1 * | 9/2003 | Laker | 439/76.1 |
| 2004/0185703 A1 * | 9/2004 | Lee | H01R 4/2454 439/417 |
| 2005/0095902 A1 | 5/2005 | Zhang et al. | |
| 2005/0266703 A1 * | 12/2005 | Noda | H01R 4/028 439/66 |
| 2007/0232127 A1 | 10/2007 | Lin | |
| 2008/0318478 A1 * | 12/2008 | Nelson et al. | 439/620.01 |
| 2009/0075494 A1 | 3/2009 | Crighton | |
| 2010/0075537 A1 | 3/2010 | McIntire et al. | |
| 2011/0195593 A1 * | 8/2011 | McGrath | H01R 12/594 439/345 |
| 2013/0270000 A1 | 10/2013 | Buck et al. | |
| 2014/0191457 A1 | 7/2014 | Sharma et al. | |

FOREIGN PATENT DOCUMENTS

| | | |
|---|---|---|
| KR | 20 2009/0011286 | 11/2009 |
| WO | WO 2012/072968 | 6/2012 |

* cited by examiner

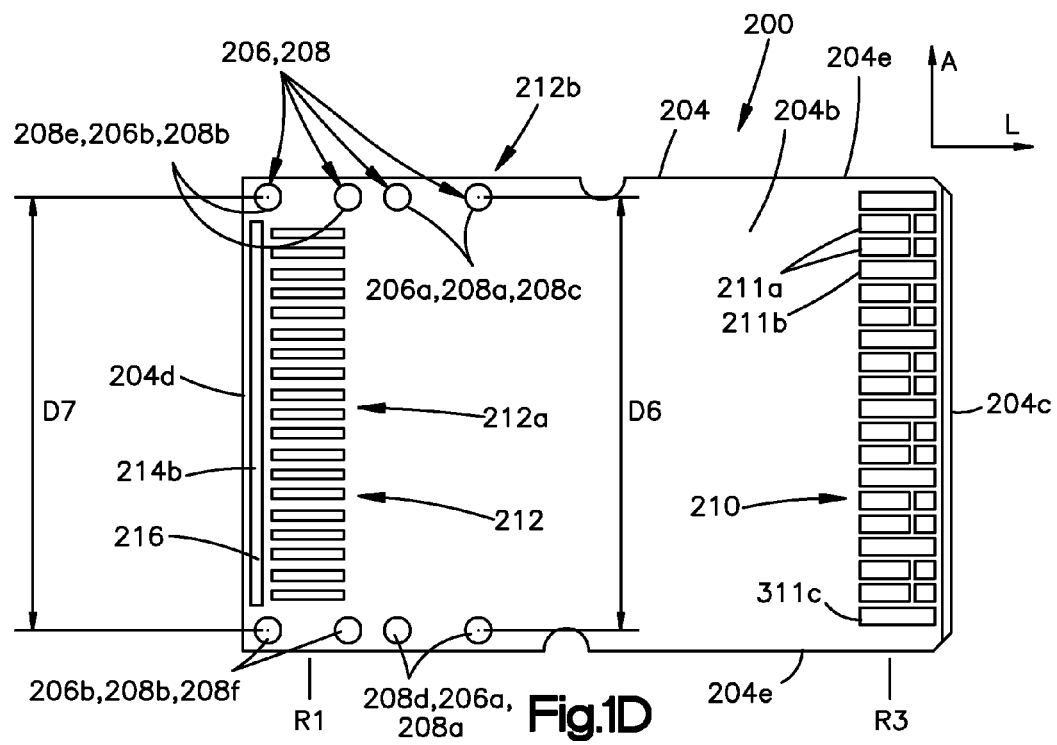
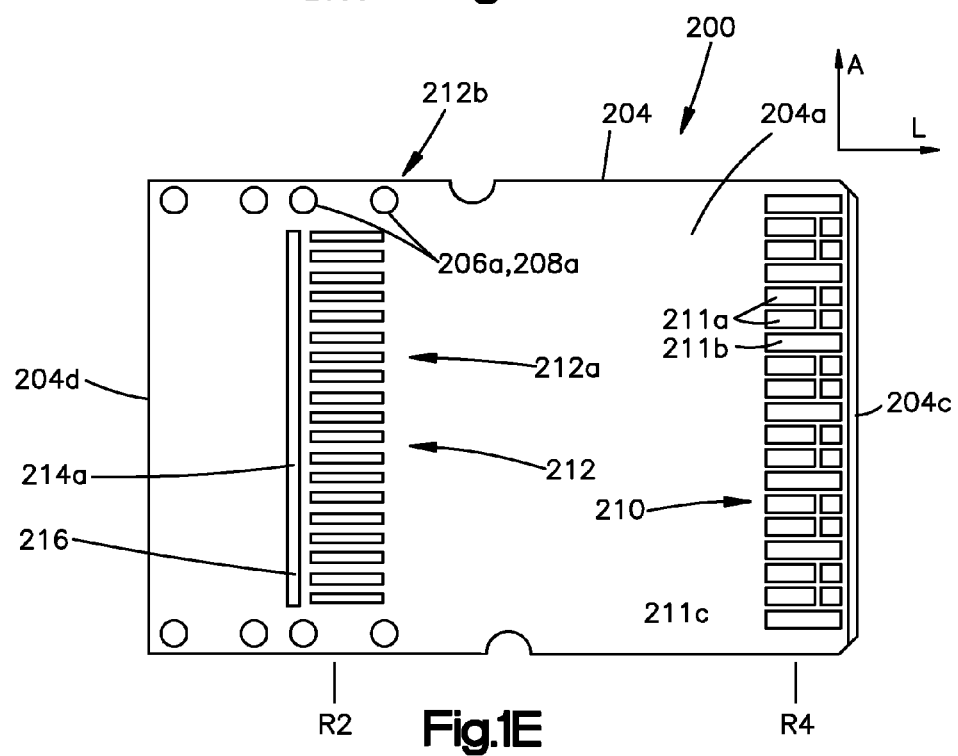

CABLE RETENTION HOUSING

CROSS-REFERENCE TO RELATED APPLICATIONS

This application claims the benefit of U.S. Provisional Application No. 61/589,537 filed Jan. 23, 2012, the contents of which are hereby incorporated by reference herein in its entirety.

BACKGROUND

Cable assemblies can be used to electrically connect one electrical component to another electrical component. For instance, high speed signal cables can be electrically connected to a substrate to construct a plug type electrical connector configured to be mated to a complementary receptacle connector. In connecting high speed signal cables to a substrate, insulating layers of the cable may be removed thereby exposing signal conducts. These exposed signal conductors may result in electromagnetic interference, such as cross talk. Mitigating such electromagnetic interference is desirable.

SUMMARY

In accordance with an embodiment, a retention housing configured to be mounted to a substrate can include a housing body that includes a upper wall that at least partially defines at least one cavity configured to receive at least one cable. The retention housing can further include at least one mounting member extending from the housing body. The at least one mounting member can be configured to attach to the substrate. The at least one mounting member can further be configured to extend through an aperture of the substrate. The upper wall can be positioned such that when the retention housing is mounted to the substrate, the upper wall compresses at least a portion of the at least one cable against the substrate so as to bias the portion of the at least one cable against a ground element supported by an upper surface of the substrate.

In accordance with another embodiment, a retention housing configured to be mounted to a substrate to which a plurality of cables are mounted, the substrate defining a first thickness and one of the plurality of cables defining a second thickness in a direction substantially parallel to the first thickness, such that a cumulative thickness is defined by a combination of the first and second thicknesses, can include a housing body that includes a upper wall that at least partially defines at least one cavity configured to receive at least one cable. The retention housing can further include at least one mounting member extending from the housing body. The retention housing can define a dimension that extends between the mounting member and the upper wall that is less than the cumulative thickness, such that when the housing is mounted to the substrate, the upper wall compresses at least a portion of the at least one cable against the substrate until the cumulative distance is reduced to substantially equal the dimension.

A method of electrically connecting a plurality of cables to a substrate in accordance with an embodiment can include the step of mounting ends of a plurality of cables onto a surface of a substrate such that an exposed portion of a respective ground jacket of each of the plurality of cables contacts a respective portion of a ground element supported by the surface of the substrate. The method can further include the step of mounting retention housing to the surface of the substrate. The retention housing can have an upper wall that at least partially defines a plurality of cable-receiving cavities, such that the respective end of each of the plurality of cables is received in a corresponding one of the plurality of cavities. Each exposed portion of a respective ground jacket of each of the plurality of cables can be compressed between the upper wall and the ground element when the retention housing is mounted to the substrate.

A method of mounting a retention housing onto a substrate in accordance with an embodiment can include the step of providing or teaching the use of a plurality of cables having at least one conductor surrounded by an electrically isolative layer, and at least one ground jacket that surrounds the electrically isolative layer, and a substrate that includes a common ground element that is supported by a surface of the substrate and a contact pad that is supported by the surface of the substrate, and a retention housing including 1) a housing body that includes a upper wall, and 2) a mounting member that extends from the housing body. The method can further include the step of teaching the step of mounting the cables to the substrate such that the conductor is in electrical communication with the contact pad. The method can further include the step of teaching the step of mounting the mounting member to the substrate so as to mount the retention housing to the substrate surface, wherein the upper wall biases the ground jacket of each of the plurality of cables against the common ground element so as to establish a ground path through each of the ground jackets of the plurality of cables.

BRIEF DESCRIPTION OF THE DRAWINGS

The foregoing summary, as well as the following detailed description of an example embodiment of the application, will be better understood when read in conjunction with the appended drawings, in which there is shown in the drawings example embodiments for the purposes of illustration. It should be understood, however, that the application is not limited to the precise arrangements and instrumentalities shown. In the drawings:

FIG. 1D is a top elevation view of the substrate illustrated in FIG. 1C;

FIG. 1E is an elevation view of the substrate illustrated in FIG. 1C;

DETAILED DESCRIPTION

Figure 1A:
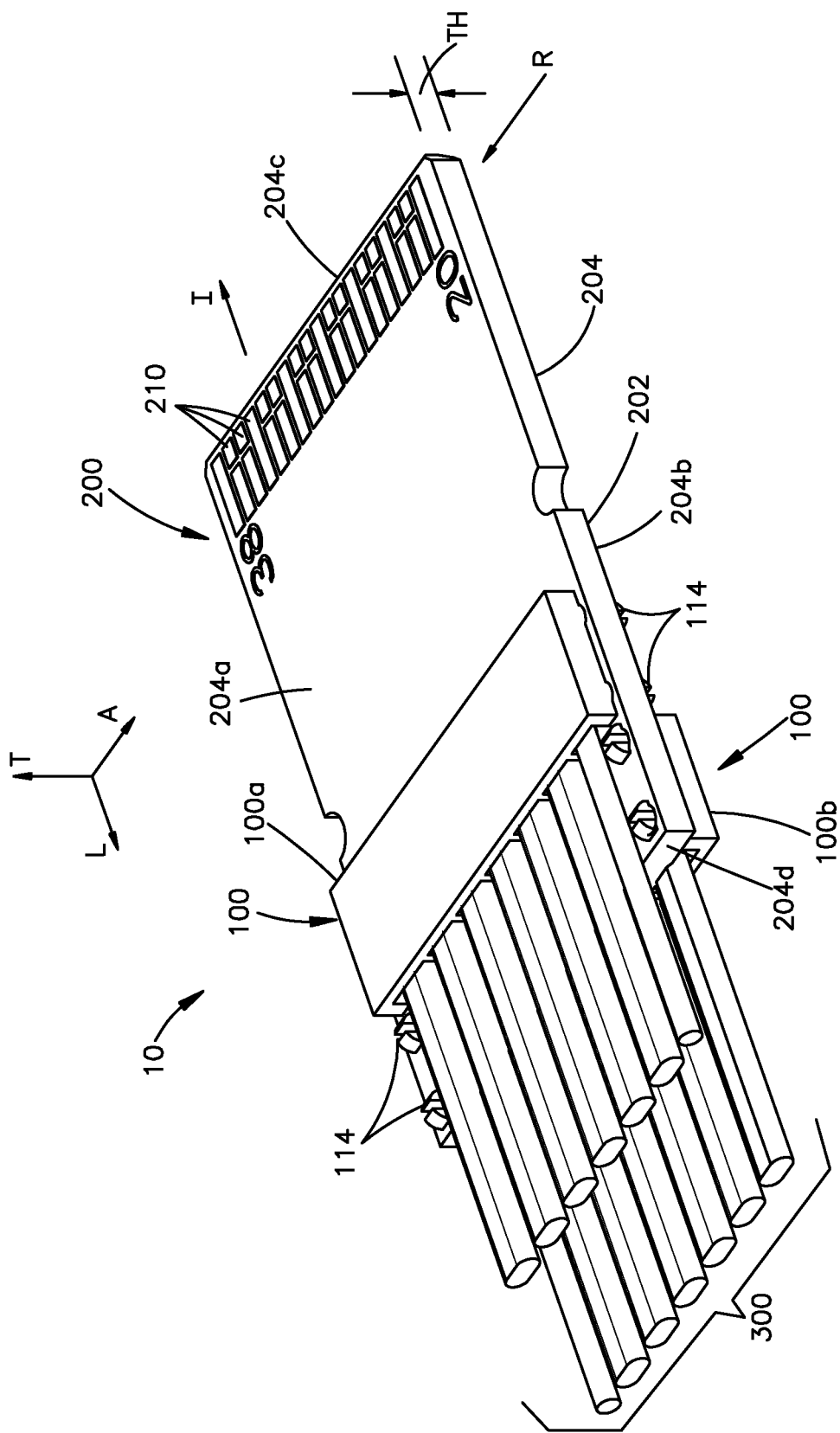
FIG. 1A is a perspective view of a cable assembly in accordance with an embodiment.

Referring initially to FIGS. 1A-F, an assembly 10 can include a substrate 200, such as a printed circuit board 202, at least one cable 300, such as a plurality of cables 300 configured to be mounted to the substrate so as to be placed in electrical communication with respective electrically conductive traces of the substrate 200, and at least one retention housing 100, such as a first retention housing 100a and a second retention housing 100b, that are configured to secure respective ones of the plurality of cables 300 to the substrate 200 and enclose the area of the plurality of cables 300 where the cables are secured to the substrate. In this regard, the retention housings 100 can be referred to as cable retention housings 100 that are configured to suppress crosstalk between adjacent cables 300, and can further be configured to compress the cables 300 against the substrate 200 when the cable retention housings 100 are mounted to the substrate 200.

Figure 1B:
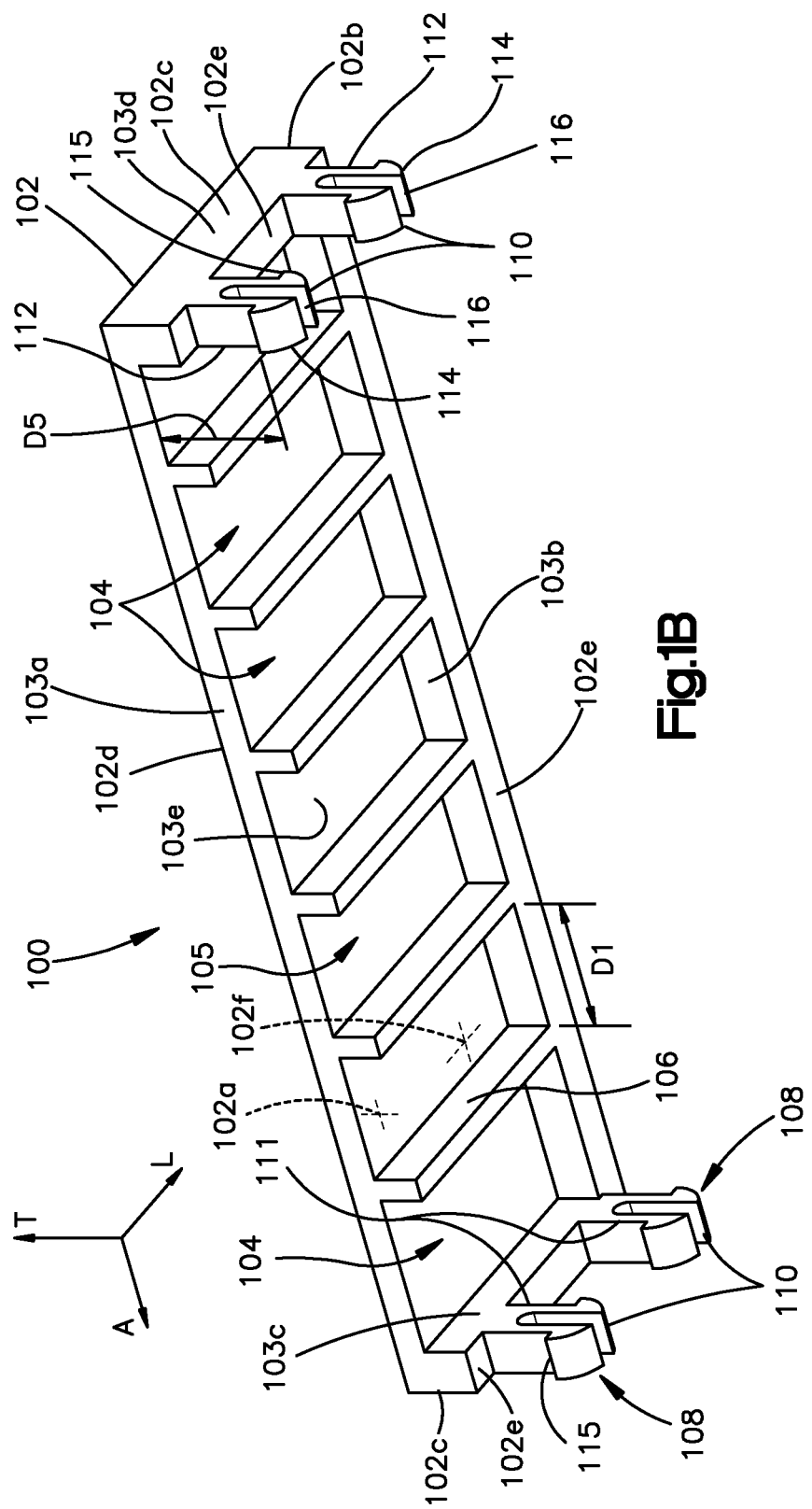
FIG. 1B is perspective view of a retention housing of the cable assembly illustrated in FIG. 1A.
Figure 1C:
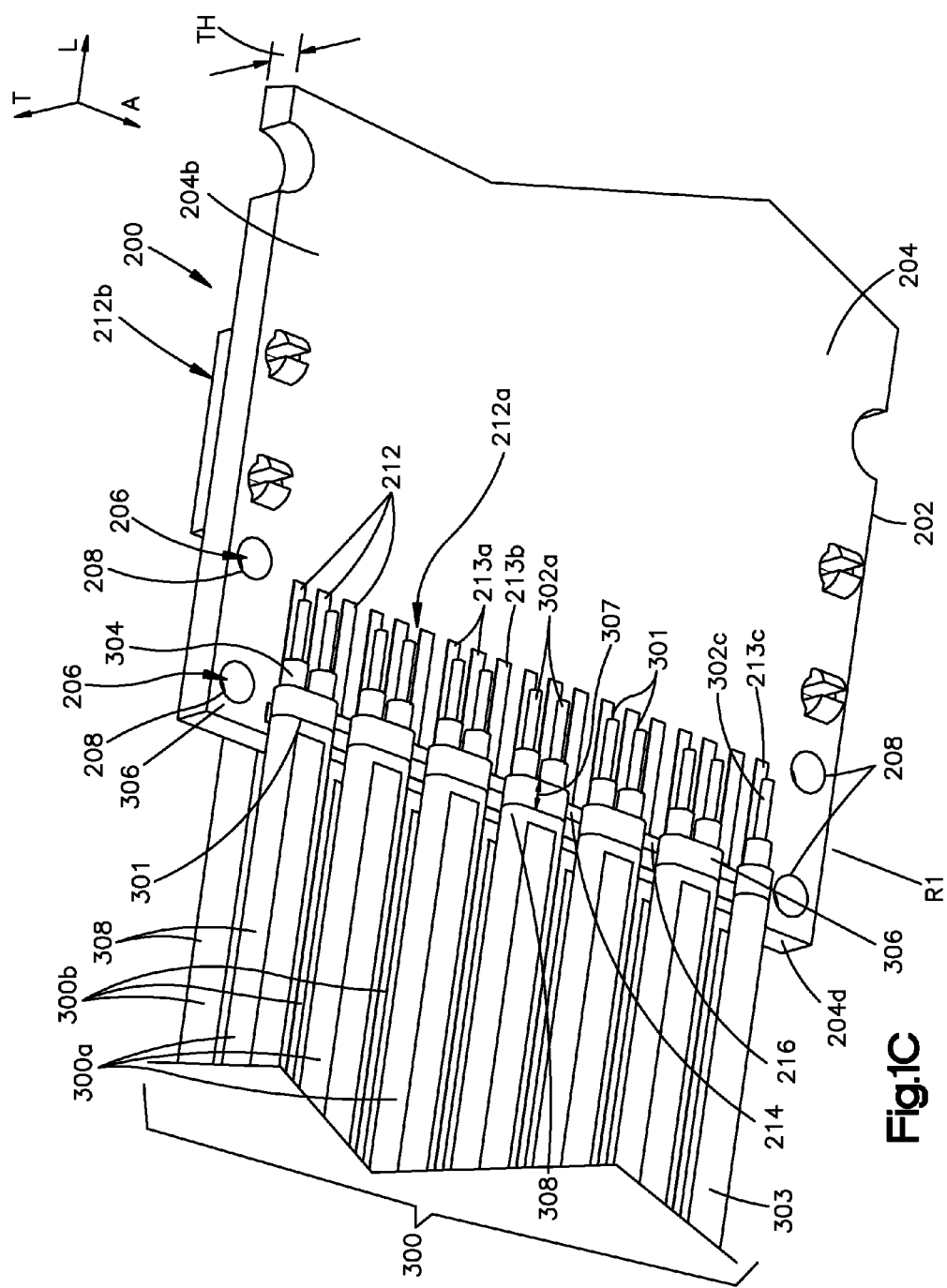
FIG. 1C is a perspective view of first and second pluralities of cables mounted to opposed sides of a substrate component of the cable assembly illustrated in FIG. 1A.

Referring now to FIGS. 1C-E, the substrate 200 includes a substrate body 204 that defines a pair of opposed surfaces. For instance, the substrate body 204 defines a first or upper surface 204a and an opposed second or lower surface 204b spaced from the upper surface 204a along the transverse direction T so as to define a thickness TH of the substrate body 204. The substrate body 204 can further define a rear edge 204c configured to mate to a complementary electrical component and an opposed front edge 204d that is spaced from the rear edge 204c along the longitudinal direction L where direction L is substantially perpendicular to the transverse direction T. The substrate body 204 may also define opposed sides 204e that are spaced from each other along a lateral direction A, where direction A is substantially perpendicular to transverse direction T and longitudinal direction L.

The substrate 200 further includes at least one mounting member 206 such as a plurality of mounting members 206 that are configured to mate with the retention housings 100 so as to mount the retention housings 100 onto the substrate 200. For instance, the mounting members 206 can include at least a first mounting member 206a such as a first plurality of mounting members 206a and at least a second mounting member 206b such as a second plurality of mounting members 206b. First mounting member 206a may be configured to engage the first retention housing 100a so as to mount the first retention housing 100a to the substrate 200. Second mounting member 206b may be configured to engage the second housing 100b so as to mount the second retention housing 100b to the substrate 200. In the illustrated embodiment, first mounting member 206a may be associated with the upper surface 204a and configured to engage the mounting member 108 of the first retention housing 100a so as to mount the first retention housing 100a to the upper surface 204a of the substrate 200. Similarly, second mounting member 206b may be associated with the lower surface 204b and configured to engage the second retention housing 100b so as to mount the second retention housing 100b to the lower surface 204b of the substrate 200.

In accordance with an illustrated embodiment, the mounting members 206 of the substrate 200 are configured as apertures 208 that extend at least into the substrate body 204, for instance in the transverse direction T. For instance, the apertures 208 can extend through and between the opposed upper and lower surfaces 204a and 204b.

In accordance with the illustrated embodiment, the first plurality of mounting members 206a can include a first pair 208c and a second pair 208d of apertures 208a. The first pair of apertures 208c and the second pair of apertures 208d may be offset from one another along the longitudinal direction L. Further, the first pair of apertures 208c can be spaced apart from the second pair of apertures 208d along the lateral direction A a distance D6. Similarly, in accordance with the illustrated embodiment, the second plurality of mounting members 206b can include a first pair 208e and a second pair 208f of apertures 208b. The first pair of apertures 208e and the second pair of apertures 208f may be offset from one another along the longitudinal direction L. Further, the first pair of apertures 208e can be spaced apart from the second pair of apertures 208f along the lateral direction A a distance D7. Distance D6 may be the same or different than distance D7.

At least one or more, up to all, of the apertures 208a of the first plurality of mounting members 206a can be offset with respect to at least one or more, up to all, of the apertures 208b of the second plurality of mounting members 206b, for instance along the longitudinal direction L, lateral direction A, or both the longitudinal direction L and lateral direction A. For instance at least one or both apertures 208a of the first pair of apertures 208c and the second pair of apertures 208d can be offset with respect to at least one or both apertures 208b along the longitudinal direction L, lateral direction A, or both the longitudinal direction L and lateral direction A. Alternatively, apertures 208a and 208b may be aligned with another along the transverse direction T.

In addition to or in place of the mounting means 108 and mounting members 206, it will be appreciated that retention housing 100 may be mounted to the substrate in a variety of ways. To name but a few, retention housing 100 may be glued, soldered, or welded onto substrate 100.

With continuing reference to FIGS. 1C-D, in accordance with the illustrated embodiment, at least one or both of the upper and lower surfaces 204a-b can support respective pluralities of electrical contact pads 210 that are disposed along the rear edge 204c and in electrical communication with one or more electrical layers and/or traces that are carried on surfaces 204a-b of the substrate body 204 or located in the substrate body 204 between surfaces 204a-b. The contact pads 210 can be spaced from each other along the lateral direction A in a row R3 on surface 204a and a row R4 on surface 204b. Row R3 and R4 of contact pads 210 may be configured to be electrically mated with electrical contacts of a complementary electrical component when the substrate 200 is mated to the complementary electrical component along a mating, or insertion direction I that extends substantially along the longitudinal direction L, thereby placing the substrate 200 into electrical communication with the complementary electrical component. Each of the plurality of electrical contact pads 210 can be disposed adjacent to one another along a row direction R that extends substantially along the lateral direction A.

At least one or both of the upper and lower surfaces 204a-b can further support respective pluralities of electrical contact pads 212. The contact pads 212 can be configured to electrically connect to respective ones of the cables 300. The contact pads 212 are in electrical communication with the one or more of the electrical traces carried by or layers located in substrate body 204, and can thus be in electrical communication with respective complementary ones of the contact pads 210. Accordingly, cables 300 mounted to the contact pads 212 are placed into electrical communication with the complementary contact pads 210, and can thus be placed in electrical communication with the complementary electrical component that is mated with the rear edge 204c. In particular, the ends 301 of the cables 300 can define mounting ends that are mounted to respective ones of the contact pads 212. Contact pads 212 may be laterally spaced from each other in a row along row direction R, along longitudinal direction L, or along row direction R and longitudinal direction L.

In accordance with the illustrated embodiment, the contact pads 212 include a first plurality of contact pads 212a supported by the upper surface 204a of the substrate 200. Each of the first plurality of contact pads 212a are spaced laterally relative to each other along a first row R1 disposed proximate the front edge 204d. Similarly, the contact pads 212 include a second plurality of contact pads 212b supported by the lower surface 204b of the substrate 200. Each of the second plurality of contact pads 212b can be spaced from each other laterally relative to each other along a second row R2 disposed proximate the front edge 204d. First row R1 and second row R2 may extend along row direction R.

In an embodiment, rows R1 and R2 may contain the same number of contact pads 212 or contain a different number of contact pads 212. Where rows R1 and R2 contain a different number of contact pads, rows R1 and R2 may extend along the row direction R the same length or a different length. When rows R1 and R2 extend along the row different lengths, the distance D6 may be also be different than the distance D7.

In an exemplary embodiment, the first row R1 and the second row R2 may be disposed at the same distance from the front edge 204d of the substrate 200. In this arrangement, row R1 may be aligned with row R2 along the transverse direction T. Each of the second plurality of contact pads 212b along the second row R2 can also be offset longitudinally rearward along longitudinal direction L with respect to respective ones of the first plurality of contact pads 212a along the first row R1. Otherwise stated, the first plurality of contact pads 212a can be disposed closer the front edge 204d of the substrate 200 than the second plurality of contact pads 212b. It should be appreciated that while each of the first plurality of contact pads 212a are aligned with a respective contact pad of the second plurality of contact pads 212b along the transverse direction T, that the first and second pluralities of contact pads 212a-b could alternatively be laterally offset relative to one another along direction lateral direction A or the longitudinal direction L as desired. In accordance with the illustrated embodiment, the contact pads 212a-b may include a plurality of signal contact pads 213a, a plurality of ground contact pads 213b, and a low speed cable contact pad 213c. Signal contact pads 213a, ground contact pads 213b, and low speed cable contact pad 213c may be arranged in rows R1 and R2. Within rows R1 and R2, signal contact pads 213a and ground contact pads 213b may be in a repeating signal-signal-ground pattern, a ground-signal-signal pattern, or a signal-ground-signal pattern. Signal contact pads 213a and ground contact pads 213b may also be arranged in a repeating signal-signal-ground-ground pattern, a ground-signal-signal-ground pattern, or a signal-ground-signal-ground pattern.

Signal contact pads 213a, ground contact pads 213b, and low speed cable contact pads 213c may be in electrical communication with respective complementary contact pads 210, such as signal contact pads 211a, ground contact pads 211b, and a low speed cable contact pad 211c. The plurality of signal contact pads 211a and the plurality of ground contact pads 211b may be arranged in rows R3 and R4 in a similar manner similar to that of signal contact pads 213a and ground contact pads 213b in rows R1 and R2.

With continuing reference to FIGS. 1C-D, the substrate 200 can include at least one common ground element 214 such as first and second common ground elements 214a and 214b. The at least one common ground element 214 may be an electrical layer(s) carried on surfaces 204a-b of the substrate body 204 and/or a trace(s) located between surfaces 204a-b within the substrate body 204. The ground elements 214a-b may be electrically isolated from the contact pads 212a-b. In accordance with the illustrated embodiment, each ground element 214 may be at a location longitudinally forward of the respective first and second pluralities of contact pads 212a-b. For example, ground elements 214a and 214b can extend adjacent to rows R1 and R2 of respective first and second pluralities of contact pads 212a-b and along row direction R. An exemplary ground element 214 may further extend between mounting members 206, such as mounting members 206a and 206b along lateral direction A. Thus, each ground element 214 can be disposed closer to the front edge 204d of the substrate 200 than its respective plurality of contact pads 212. Thus, the ground element 214 supported by the lower surface 204b can be offset rearward with respect to the ground element 214 supported by the upper surface 204a. For example, ground element 214b may be closer to the front edge 204d than respective contact pads 212b and ground element 214a may be closer to the front edge 204d than respective contact pads 212a. Further, ground element 214a may be offset rearward of ground element 214b at the same distance along longitudinal direction L. It should be appreciated that one or more, such as all of the respective ground elements 214 can be otherwise located relative to the respective pluralities of contact pads 212, such as longitudinally rearward relative to the respective pluralities of contact pads 212, as desired.

In yet another embodiment, ground contact member 214 may be located between surfaces 204a and 204b and aligned with R1 or R2 of signal contact pads 213a and ground contact pads 213b along the longitudinal direction L. Ground contact member 214 may further extend parallel to the direction of R1 or R2 in, for example the row direction R. Ground contact pads 213b may be commoned to ground member 214 by one or more electrical traces carried on surfaces 204a-b of the substrate body 204 or layers located in the substrate body between surfaces 204a-b.

Figure 1F:
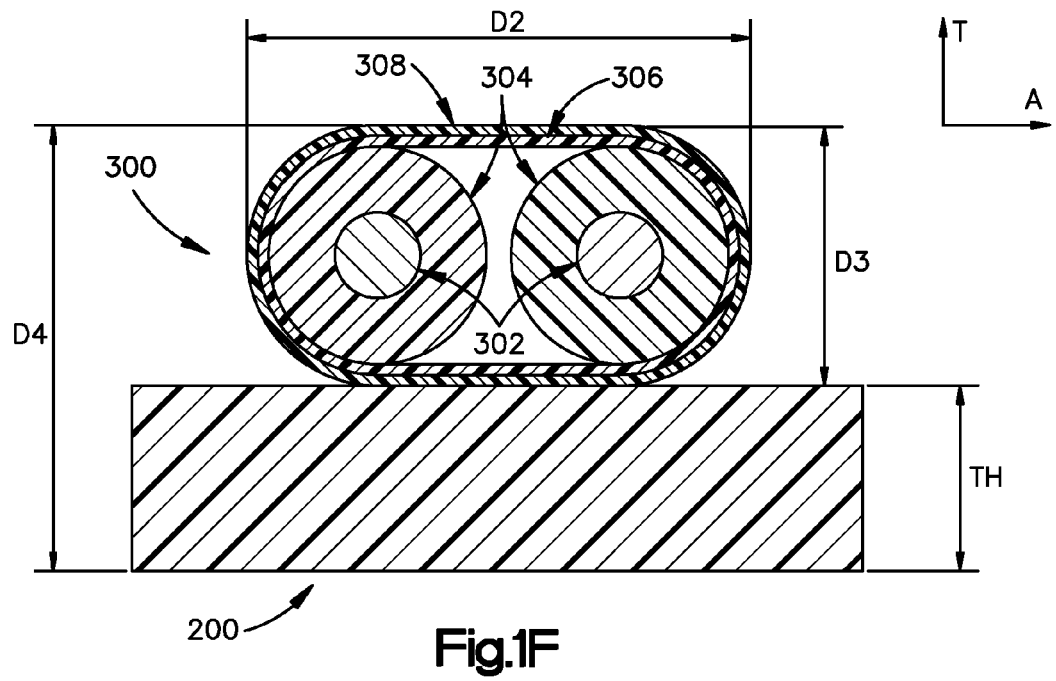
FIG. 1F is a section elevation view of the electrical assembly illustrated in FIG. 1A.

Referring primarily to FIGS. 1C and 1F, the cables 300 can each include at least one conductor 302, such as a pair of signal carrying conductors 302a, and an electrically insulative layer 304 that surrounds each of the pair of signal carrying conductors 302a. In the embodiment depicted in FIG. 1C, the electrically insulative layers 304 of each cable can reduce the crosstalk imparted by one of the signal carrying conductor 302a of the cable 300 to the other of the signal carrying conductors 302a of the cable 300. Each of the cables 300 can further include an electrically conductive ground jacket 306 that surrounds the respective insulated layer 304 of the signal carrying conductors 302a. The ground jacket 306 may further reduce crosstalk. The ground jacket 306 may be configured to be electrically connected to a respective ground plane of a complementary electrical component to which the cable 300 is mounted. For example, in accordance with the illustrated embodiment, a ground jacket 306 of a respective cable 300 may be configured to be placed into contact with a ground element 214 of the substrate 200, such as the ground bar 216 of a respective surface of the printed circuit board 202, such that the ground jacket 306 of the respective cable 300 is connected to the ground plane of the substrate 200 via the ground element 214. In this regard, the ground jacket 306 can provide an electrical path to ground, or ground path from the ground jacket 306 of the respective cable 300 to the respective ground plane of the complementary electrical component. Each of the cables 300 can further include an outer layer 308 that is electrically insulative and surrounds the respective ground jacket 306. The outer layer 308 can reduce the crosstalk imparted by the respective cable 300 to another one of the cables 300. The insulative layers 304 and 308 can be constructed of any suitable dielectric material, such as plastic. The conductors 302 can be constructed of any suitable electrically conductive material, such as copper.

Figure 4A:
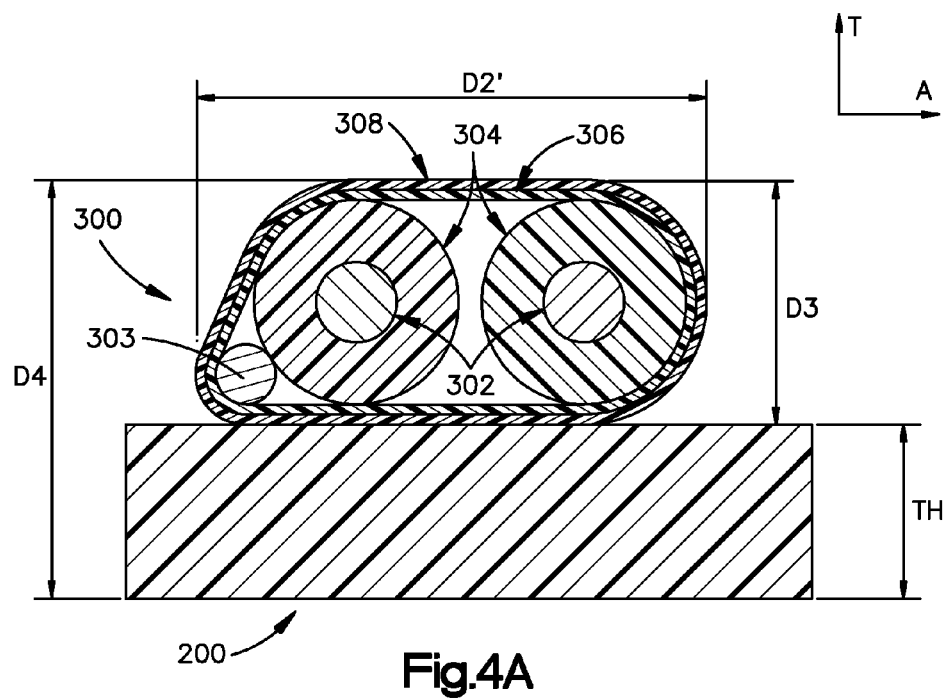
FIG. 4A is a perspective view of first and second pluralities of cables mounted to opposed sides of a substrate component of an alternative embodiment of the cable assembly illustrated in FIG. 1A.
Figure 4B:
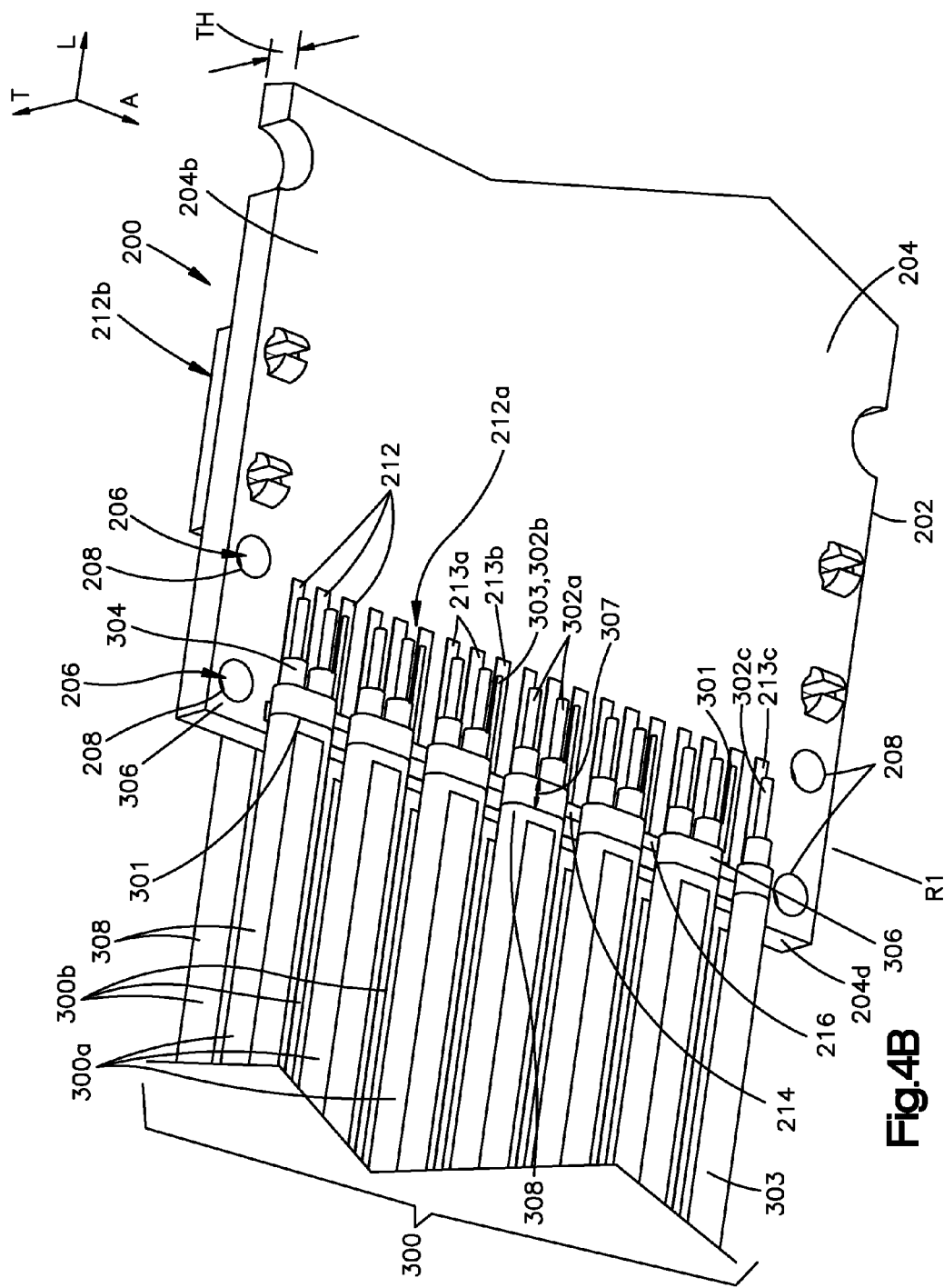
FIG. 4B is a section elevation view of an alternative embodiment of the electrical assembly illustrated in FIG. 1A.

In accordance an embodiment depicted in FIGS. 4A and 4B, the cables 300 may further include at least one ground conductor 302b, such as a drain wire, in addition to signal conductors 302a. The ground conductor 302b may be used in combination with the ground jacket 306 (i.e., the ground jacket 306 carrying the ground conductor 302b and further defining an electrical path to the ground plane) or by itself (i.e., the cable 300 containing a ground conductor 302b but no ground jacket 306). The ground conductor 302b may be surrounded by the outer layer 308. The drain wire may also be surrounded by the ground jacket 306, when ground jacket is present.

In an exemplary embodiment, ground conductor 302b may be a low speed wire 303 may also be included. Low speed wire may be a clock wire or carry signals to confirm an action has been taken. Similar to cables 300, low speed wire 303 may have a conductor 302c, insulative layers 304 and 308, as well as a ground jacket 306. Further, as depicted in FIG. 4A, low speed wire 303 may also include a ground conductor 302d. Ground conductor 302d may be used in combination with ground jacket in a manner similar to cables 300 above.

The cables 300 can include a first plurality of cables 300a that are configured to mount to the first plurality of contact pads 212a, for instance at their respective ends 301, and the cables 300 can further include a second plurality of cables 300b that are configured to mount to the second plurality of contact pads 212b, for instance at their respective ends 301. Thus, each of the first plurality of cables 300a is in electrical communication with the respective complementary contact pads 212a, and each of the second plurality of cables 300b is in electrical communication with the respective complementary contact pads 212b. At least one or both of longitudinally and laterally offsetting the ends 301 of the cables 300 relative to each other can reduce cross talk between the cables of the first and second pluralities of cables 300a and 300b Each of the first and second pluralities of cables 300a and 300b can be mounted to the substrate 200 in a variety of ways. For instance, a portion of the insulative layers 304 and 308 and the ground jacket 306 of each cable 300 can be removed from the respective conductor 302 at the end 301 so as to expose the conductors 302. Alternatively, the cable 300 can be manufactured such that the conductors 302 extend longitudinally out from the insulating layers 304 and 308 and the ground jacket 306 so as to expose the conductors 302. The exposed conductors 302 can be mounted to respective contact pads 212 at the end 301, for example by soldering the conductors 302 to the contact pad 212. In an exemplary embodiment, exposed ends 301 of signal carrying conductors 302a may be mounted to signal contact pads 213a. The end 301 of the ground conductors 302b may also be mounted to ground contact pad 213b. Respective portions of the outer insulative coating 308 can be removed such that each cable 300 has an exposed portion 307 of ground jacket 306 that contacts a respective portion of a corresponding ground element 214 of the substrate 200, such as a respective portion of a corresponding ground bar 216 supported by a respective surface of the printed circuit board 202 to which the cable 300 is mounted. Alternatively, the cable 300 can be manufactured such that the ground jacket 306 extends longitudinally out from the insulating layers 304 and 308 so as to expose a portion of the ground jacket 306. The ground jacket 306 can then be placed in electrical communication with the ground element 214.

In accordance with the illustrated embodiments, the ends 301 of the conductors 302 can define mounting ends that are mounted to respective ones of the contact pads 212. For instance, in FIG. 1C, a first plurality of cables 300a can include signal carrying conductors 302a that are configured to mount to the first plurality of contact pads 212a, for instance at their respective ends 301. The exposed ground jacket 306 for each of the plurality of cables 300a may also contact the ground element 214a. Cables 300 can further include a second plurality of cables 300b, which include conductors 302, configured to mount to the second plurality of contact pads 212b in a manner similar to cables 300a. Thus, each of the first plurality of cables 300a is in electrical communication with the respective complementary contact pads 212a, and each of the second plurality of cables 300b are in electrical communication with the respective complementary contact pads 212b.

In accordance with the embodiments described above, each of the second plurality of contact pads 212b may be offset longitudinally, laterally, or both longitudinally and laterally with respect to respective ones of the first plurality of contact pads 212a. Further, the ends 301 of the first plurality of cables 300a that are mounted to the first plurality of contact pads 212a may be offset longitudinally, laterally, or both longitudinally and laterally with respect to the ends 301 of the second plurality of cables 300b that are mounted to the second plurality of contact pads 212b. It can thus be said that the ends 301 of the first plurality cables 300a are offset, and in particular offset along the longitudinal direction L, the lateral direction A, or both the longitudinal direction L and the lateral direction A. By offsetting the ends 301 of the cables 300 relative to each other, you can reduce cross talk between the cables of the first and second pluralities of cables 300a and 300b.

In accordance with the illustrated embodiment, the retention housings 100 can have a housing body 102. The housing body 102 can assume any suitable size and shape as desired. For example, the housing body 102 may have a substantially rectangular shape comprising substantially planar walls. Walls may be substantially planar where two surfaces that extend a distance in a first dimension and a second dimension a distance that is substantially longer than a distance extending between the two surfaces in a third direction. The housing body 102 may also assume a more spherical shape where, for example, the walls of the housing body 102 have been rounded off.

In accordance with an illustrated embodiment, the housing body 102 defines a front end 102a and an opposed rear end 102b that is spaced from the front end 102a along a longitudinal direction L, first and second sides 102c that are spaced from each other along a lateral direction A that is substantially perpendicular to the longitudinal direction L, and an outer end 102d and an inner end 102e that is spaced from the outer end 102d along a transverse direction T that is substantially perpendicular to the longitudinal direction L and the lateral direction A. The retention housings 100 are configured to be mounted to the substrate 200 such that the inner end 102e is spaced closer to the substrate 200 than the outer end 102d. The inner end 102e of the housing body 102 can face the substrate 200 when the retention housings 100 are mounted to the substrate 200. The inner end 102e of at least a portion of the housing body 102 can abut the substrate 200 when the respective retention housing 100 is mounted to the substrate 200.

The housing body 102 is illustrated in FIG. 1B in an orientation such that the transverse direction T is vertical and the longitudinal and lateral directions L and A are horizontal, though it should be appreciated that the orientation of the housing body, and of the assembly 10, can differ during use. In accordance with the illustrated embodiment, the cables 300 are elongate in an elongated direction, such as the longitudinal direction L, when mounted to the substrate 200. The cable 300 may also have a diameter extending in a direction that is perpendicular to the elongated direction, such as lateral direction A, transverse direction T, or a combination of lateral direction A and transverse direction T. Furthermore, in accordance with the illustrated embodiment, the substrate 200 can be elongate in a plane that is substantially parallel to the longitudinal and lateral directions L and A, respectively. In the illustrated orientation, the transverse direction T is vertical and the longitudinal and lateral directions L and A are horizontal, though it should be appreciated that the orientation of the assembly 10 can differ during use.

The body 102 can include an upper wall 103a, which may also be referred to as a base 103a, that can be disposed at the outer end 102d. As described in more detail below, according to an embodiment of the invention, inner, or cable facing surface 103e of the upper wall 103a may be configured to compress one or both of cables 300 and cables 303 against the substrate 200 when the housing body 102 is mounted to the substrate 200. The upper wall 103a can define any suitable size and shape as desired. For instance, in accordance with the illustrated embodiment, the upper wall 103a can be substantially planar, and can for instance extend along a plane defined by the longitudinal direction L and the lateral direction A. The body 102 can further include a rear wall 103b, such as a plurality of rear walls 103b, that extends along the transverse direction T from the upper wall 103a and between divider walls 106 and side walls 103c and 103d. For instance, the rear wall 103b can extend from the rear end 102b of the upper wall 103a, or any alternative location of the upper wall 103a. The rear wall 103b can be elongate in the lateral direction A and be substantially planar. The body 102 can further include a pair of side walls 103c and 103d that extends along the transverse direction T from the upper wall 103a. For instance, the side walls 103c-d can extend from the sides 102c of the upper wall 103a, or any alternatively location of the upper wall 103a. The side walls 103c-d can be elongate in the longitudinal direction, such that the rear wall 103b extends between the side walls 103c-d, and may be substantially planar. The rear wall 103b and the side walls 103c-d can extend from the upper wall 103a to a substantially same depth, such that the inner ends 102e of the rear wall 103b can be substantially aligned with the inner ends 102e of the side walls 103c-d. Side walls 103c-d may define a distal end attached to the rear wall 103b, and a proximal end spaced from the distal end along a longitudinal direction.

The retention housing 100 can define at least one cable-receiving cavity 105. For instance, the cavity 105 can be at least partially defined by the upper wall 103a, the rear wall 103b, and the opposed side walls 103c-d. In this regard, it should be appreciated that the front end 102a of the housing body 102 can be open such that selective ones of the plurality of cables 300 can extend through the open front end 102a and into the cavity 105 when the retention housing 100 is mounted to the substrate 200. Cavity 105 may also have an open bottom end 102f located opposite the upper wall 103a along the transverse direction T.

The housing body 102 can further include at least one divider wall 106 such as a plurality of divider walls 106 that are disposed in the cavity 105 and are spaced from each other along the lateral direction A. The divider walls 106 can extend along the transverse direction T from the upper wall 103a so as to define a depth in the transverse direction T. In accordance with the illustrated embodiment, the divider walls 106 can extend between the front end 102a and the rear wall 103b along the longitudinal direction L and may be substantially planar. Thus, the divider walls 106 can extend substantially parallel to each other and the side walls 103c-d. For instance, in accordance with the illustrated embodiment, the divider walls 106 can extend from the front end 102a to the rear wall 103b along the longitudinal direction L. The divider walls 106 can extend from the upper wall 103a at the same depth along the transverse direction T as the rear wall 103b and side walls 103c-d, such that the inner ends 102e of the divider walls 106 are substantially aligned, or co-planar with, the inner ends 102e of the rear wall 103b and side walls 103c-d. Alternatively, at least one up to all of the divider walls 106 can extend from the upper wall 103a to a depth along the transverse direction T that is less than the depth of at least one or both of the rear wall 103b and side walls 103c-d, such that the inner ends 102e of at least one up to all of the divider walls 106 are recessed with respect to the inner ends 102e of at least one or both of the rear wall 103b and side walls 103c-d.

The divider walls 106 are disposed in the cavity 105 and each have one of another divider wall 106 or one of side walls 103c-d on either side. Each side wall 103c-d has one of a divider wall 106 or the other side wall 13c-d on one side. Divider walls 106 thus divide the cavity 105 into at least two, such as a plurality of, cable-receiving cavities 104 that define a maximum dimension in the lateral direction A that is less than the dimension of the cavity 105 in the lateral direction A. The divider walls 106 are configured to physically and electrically isolate a first of the at least two cavities 104 from a second of the at least two cavities 104 that is adjacent the first of the at least two cavities 104. The retention housings 100 are configured to be mounted to the substrate 200 such that the cavities 104 receive select ones of the plurality of cables 300. Each of the cavities 104 is thus configured to receive a fewer number of cables 300 than the cavity 105. For instance, in the illustrated embodiment, the divider walls 106 are spaced from one or both of each other or the side walls 103c, 103d a distance D1 (see FIG. 1B) in the lateral direction A that is greater than a lateral cross-sectional dimension D2 (see FIG. 1F) of each of the cables 300, such that each of the cavities 104 is configured to receive at least one of the plurality of cables 300. The distance D1 can be less than the combined lateral dimension of a pair of adjacent ones of the plurality of cables 300, such that each of the cavities 104 receives only a single cable 300 when the respective retention housing is mounted to the substrate 200. Accordingly, each cavity 104 is configured to receive and isolate an end 301 of a respective one of the cables 300 from ends 301 of other ones of the plurality of cables 300 that are disposed in respective adjacent ones of the cavities 104, for instance to reduce electrical cross talk between the cables 300 when the cables 300 carry data signals. It should be appreciated, however, that the cables 300 can alternatively be configured as power cables that transmit electrical power, and the retention housing 100 can secure the power cables to the underlying substrate 200 in the manner described herein.

In accordance with an embodiment, each of the cable receiving cavities 104 may have a rectangular prism shape defined by the retention housing 100. The rectangular prism shape may have six substantially planar sides. Four of the rectangular prism's shape may be bounded on four sides by four walls of the retention housing 100. For example, four of upper wall 103a, rear wall 103b, side walls 103c-d, and divider walls 106 may bound each cavity on four sides. The remaining two sides may be that of open front end 102a and open bottom end 102f. Open front end 102a and open bottom end 102f may not be bounded by the retention housing 100.

In accordance with an illustrated embodiment, where cables 300 include signal conductors 302a and a ground jacket 306, the inner, or cable facing surface 103e of the upper wall 103a of each retention housing 100 may compress the exposed portions 307 of the ground jackets 306 of the cables 300 into contact with the corresponding ground element 214, thereby commoning the ground jackets 306 together. Alternatively, each retention housing 100 can include one or more projections that extend downward from the housing body 102, such as the inner surface 103e of the upper wall 103a, that are configured to compress the exposed portions 307 of the ground jackets 306 of the cables 300 into contact with the corresponding ground element 214.

In accordance with another illustrated embodiment, where cables 300 include at least one ground conductor 302b in addition to signal conductors 302a, inner, or cable facing surface 103e of the upper wall 103a may compress cables 300 into contact with ground element 214. For example, where substrate 200 carries a ground element 214 on surface 204 and where cable 300 includes a ground jacket 306 in addition to a ground conductor 302b and signal conductors 302a, inner, or cable facing surface 103e of the upper wall 103a may compress cables 300 into contact with ground element 214 by, for example, compressing ground jacket 306 against the ground element 214. In another example, where substrate 200 carries a ground element 214 between surfaces 204a-b or where cable 300 does not include a ground jacket 306, cable facing surface 103e of the upper wall 103a may not compress cables 300 into contact with ground element 214. In yet another example, where substrate 200 carries a ground element 214 between surfaces 204a-b or where cable 300 does not include a ground jacket 306, inner, or cable facing surface 103e of the upper wall 103a may compress cables 300 by, for example, compressing outer layer 308 insulative layers 304 or 308 against surfaces 204a-b. Low speed wire 303 may include ground conductor 302d or may interact with the upper wall 103a in a manner similar to cable 300 above.

The retention housing 100 can include at least one mounting member 108, such as a plurality of mounting members 108, that extends from the housing body 102, for instance along the transverse direction T, and are configured to mate with complementary mounting members 206 of the substrate 200 (see FIG. 1C) so as to mount the retention housing 100 to the substrate 200. For instance, the mounting members 108 can extend from at least one or more up to all of the upper wall 103a, the rear wall 103b, the side walls 103c-d, and the divider walls 106. In one embodiment, the mounting members 108 can extend from the inner ends 102e of at least one or more up to all of the upper wall 103a, the rear wall 103b, the side walls 103c-d, and the divider walls 106. In accordance with the illustrated embodiment, the mounting members 108 extend from the inner ends 102e of the side walls 103c-d.

In accordance with an illustrated embodiment, the mounting members 108 are configured as posts 110. The illustrated retention housing 100 includes first and second pairs of mounting members 108 configured as posts 110. The first pair of posts 110 extends from one of the side walls 103c, and the second pair of posts extends from the other of the side walls 103d. Each post of the respective pair of posts 110 can be spaced from the other post of the respective pair of posts 110 along the longitudinal direction L. Each post 110 can have a post body 111 that includes a proximal end and an opposed distal end. The proximal end of the post body 111 can be configured as a shaft portion 112 that extends down from the housing body 102, such as a respective one of the side walls 103c-d. The distal end of the post body 111 can be configured as a head 114 that defines at least a portion that has a cross sectional dimension, such as a diameter, in one or both of the longitudinal and lateral directions L and A, that is greater than a cross-sectional dimension of the shaft portion 112 in a corresponding one or both of the longitudinal and lateral directions L and A. Furthermore, the head 114 can be generally conically shaped, such that the distal end of the head 114 has a cross-sectional dimension less than that of the proximal end of the head 114. The proximal end of the head 114 can define an engagement surface 115 that is configured to rest against the substrate 200 when the head 114 is mounted to the substrate 200. Each post 110 can define a slot 116 that can extend at least into, for instance entirely through, the head 114 along the transverse direction T. The slot 116 can further extend at least partially into the shaft 112 along the transverse direction T. Accordingly, the slot 116 can divide the post 110 into a pair of portions that can be resiliently biased inward toward one another. It should be understood, however, that the head 114 can be a variety of alternative shapes, such as rectangular.

In yet another embodiment, the mounting members 108 of first retention housing 100a may be configured to attach to mounting members 108 of second retention housing, of vice versa. The first retention housing 100a may attach to mounting member 108 when, for example, second plurality of contact pads 212b are not offset from the first plurality of contact pads 212a in either the longitudinal direction L or the lateral direction A and retention housing 100a and 100b may use a the same mounting members 206, such as, for example, first pair 208c and a second pair 208d of apertures 208a. Alternatively, the mounding members 108 of first retention housing 100a and second retention housing 100b may attach to one another through the same mounting members 206, such as when the first retention housing 100a and the second retention housing 100b are aligned with one another along the transverse direction T. In accordance with an illustrated embodiment, the mounting members 108 of retention housing 100a and retention housing 100b may be spaced along the longitudinal direction L and lateral direction A such that they align with mounting members 206a and 206b, respectively. For example, mounting members 108 of retention housing 100a and retention housing 100b may be spaced along the lateral direction A a distance equal to D6 and D7, respectively.

As described above, each retention housing 100 can be configured to mount to a respective surface of an underlying substrate 200. For instance, the first retention housing 100a is configured to be mounted to an upper surface 204a of the substrate 200, and the second retention housing 100b is configured to be mounted to a lower surface 204b of the substrate. In accordance with the illustrated embodiment, the apertures 208a-b can define a cross-sectional dimension (such as a diameter) in at least one or both the lateral and longitudinal directions A and L that is less than the respective cross-sectional dimension of the heads 114 of the mounting members 108. The cross-sectional dimension of the apertures 208a-b can further be at least substantially equal to or greater than the cross-sectional dimension of the respective shafts 112.

Accordingly, when the retention housings 100a-b are mounted to the substrate 200, the posts 110 are inserted into respective ones of the apertures 208, such that the portions of each post 110 will deflect inward toward each other as the head 114 advances through the aperture 208. When the head 114 has advanced through the aperture 208 to the opposite surface of the substrate 200, the two halves of the post 110 can resiliently snap back to their original relaxed positions, such that respective distal surfaces of the head 114 come to rest against the opposite surface of the substrate 200, thereby placing the posts 110 into engagement with the substrate 200, and securing the retention housing 100 in a mounted position relative to the substrate 200. For instance, when the first retention housing 100a is mounted to the first surface 204a of the substrate, the respective heads 114 advance through the corresponding apertures 208a such that the head 114 abuts the opposed second surface 204b. Likewise, when the second retention housing 100b is mounted to the second surface 204b of the substrate 200, the respective heads 114 advance through the corresponding apertures 208b such that the head 114 abuts the opposed first surface 204a. Thus, the mounting members 108 can be configured to secure the retention housing 100 in a mounted position relative to the substrate 200, for instance by engaging the engagement surface 115 to a surface of the substrate 200 that is opposite the surface of the substrate 200 to which the retention housing 100 is mounted.

Referring to FIGS. 1A and 1C, in an embodiment, when the housing 100a-b is mounted to surface 204a-b of substrate 200, open bottom end 102f of cavity 105 may be bounded by surface 204a-b, thereby leaving front end 102a open but closing the cavity on the remaining five sides. Further, when housing 100a-b is mounted to surface 204a-b of substrate 200, a plurality of contact pads 212 may be disposed inside of each cavity 105. Contact pads 212 may be supported by surface 204a b which may be located in the cavity 105 opposite the upper wall 103a along the transverse direction T. For example, a cavity 105 may contain one or both of a differential pair of signal contact pads 213a and a ground contact pad 213b. Cavity 105 may also contain a low speed cable contact pad 213c.

Referring to FIGS. 1B and 1C, in an exemplary embodiment, the housing 100 may be configured such that when the housing 100 is mounted to the substrate 200, the divider walls 106 come into contact with one or more, up to all, of ground contact pads 213b. Divider walls 106 may also come into contact with the common ground member 214. Rear wall 102b may also contact a surface 204a-b of substrate 200 rearward from contact pads 213a and ground contact pads 213a along a direction extending from the front surface 204d towards the rear surface 204c along longitudinal direction L. One or more of the divider walls 106, rear wall 103b, upper wall 103a, side walls 102c-d, and substrate 200 encloses individual cables, the individual cables containing a pair of signal conducts 302a, on five sides in individual cavities, thereby shielding signal conductors from receiving electromagnetic interference from other outside sources and preventing signal conductors 302a from imparting electromagnetic interference on other signal conductors 302a. Phrased differently, retention housing reduces signal leakage by enclosing the signal conductors 302a on all sides other than open front end 102a. Further, as the divider walls 106 contact the ground contact pads 213b and the common ground member 214, the retention housing 100 is well grounded, which further suppresses electromagnetic interference.

Figure 4C:
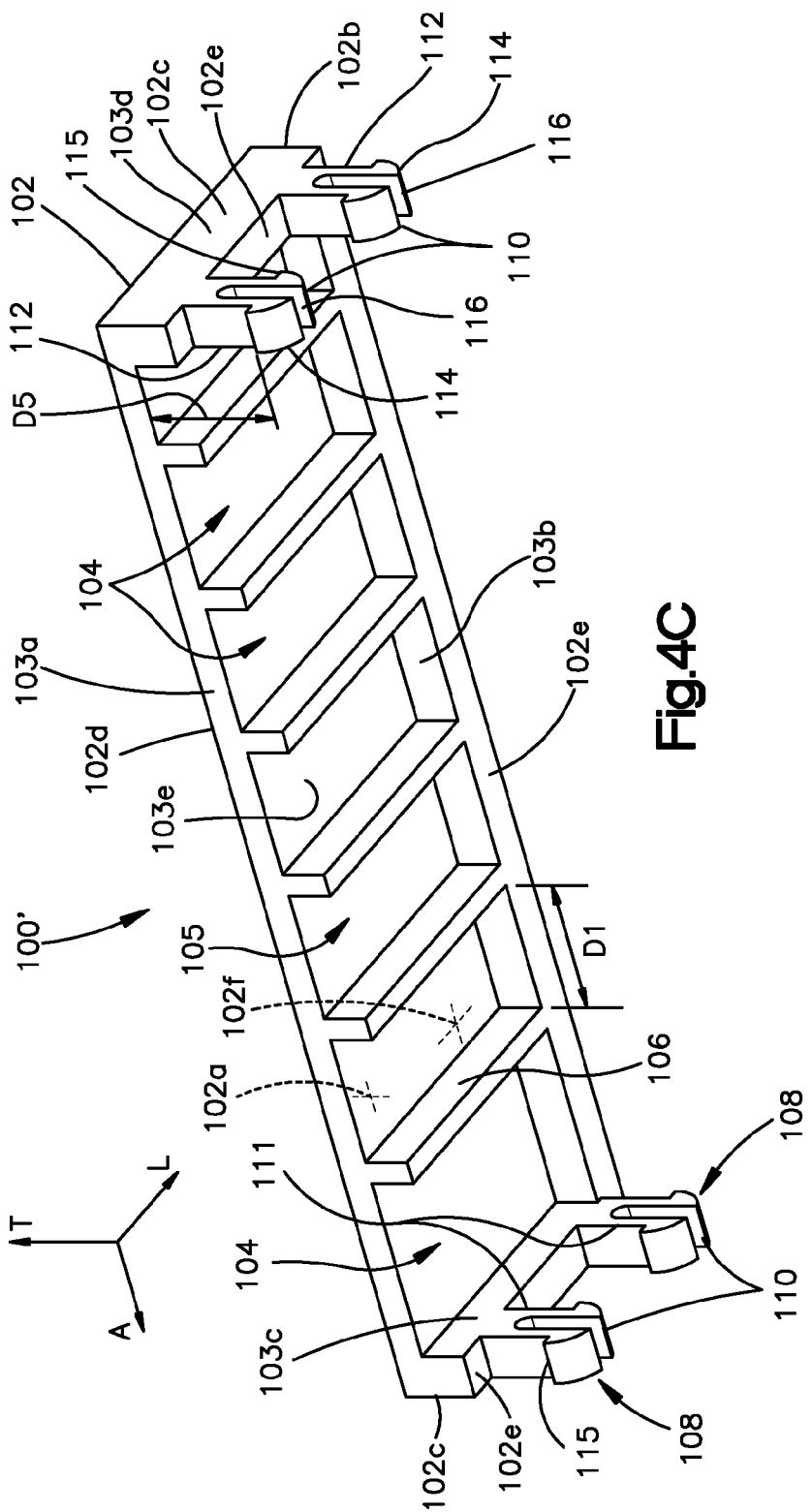
FIG. 4C is perspective view of a retention housing.

In the exemplary embodiment described in connection with FIGS. 4A and 4B, the housing 100', shown in FIG. 4C, may be configured such that when the housing 100' is mounted to the substrate 200, the divider walls 106 come into contact with a surface 204a-b of the substrate 200 at a location in between a signal contact pad 213a and a ground contact pad 213b. For example, divider walls 106 may come into contact with a surface 204a-b of the substrate 200 at a location in between a signal contact pad 213a and a ground contact pad 213b but not come into contact with signal contact pads 213a or ground contact pad 213b. Divider walls 106, rear wall 103a, upper wall 103a, and substrate 200 enclose individuals cables 300, containing a pair of signal conductors 302a and a ground conductor 302b, on five sides in individual cavities, thereby shielding the cable's 300 signal conductors from receiving electromagnetic interference from other outside sources and preventing signal conductors 302a from imparting electromagnetic interference on other signal conductors 302a. Phrased differently, retention housing reduces signal leakage by enclosing the signal conductors 302a on all sides other than open front end 102a. As noted above, retention housing 100', like retention housing 100, may constructed of, or coated with, conductive material, non-conductive material, or electrically conductive lossy material.

When divider walls 106 contact a surface 204a-b of the substrate 200 at a location in between a signal contact pad 213a and a ground contact pad 213b, divider walls 106 may provide retention housing 100' with a path to ground by extending from the rear wall 102b forward along the longitudinal direction L such that the divider walls 106 come into contact with the common ground member 214, when common ground member 214 is present. Additionally, retention housing may be coupled to a ground plane located between surfaces 204a-b by, for example, coming into contact with a via connected to a ground layer in the substrate 200 once mounted to the substrate. Alternatively, mounting members 108 may come into contact with a ground layer located between surfaces 204a-b once mounted to the substrate. It will be appreciated that while FIG. 1C depicts two signal contact pads 213a as being located between adjacent ground contact pads 213, any number of signal contact pads 213a may be located between adjacent ground contact pads 213. Alternatively, the contact pads 212 of the substrate 200 may be configured to conform to the spacing of the divider walls 106 of the housing 100.

As described above, each of the plurality of cables 300 includes a first or lateral cross-sectional dimension D2. Each of the plurality of cables 300 further includes a second or transverse cross-sectional dimension or thickness D3 (see FIG. 1F) that can be less than the lateral cross-sectional dimension D2. Alternatively, the second or transverse cross-sectional dimension D3 can be substantially equal to or greater than the first or lateral cross-sectional dimension D2. It should be appreciated that when the cables 300 are mounted to the substrate, the assembly 10 defines a cumulative transverse dimension or thickness D4 (see FIG. 1F) that is defined by combining the thickness TH of the substrate and the transverse cross-sectional dimension D3 of one of the cables 300 at the end 301 of the cable 300. For instance, the substrate 200 defining a first thickness TH, and one of the pluralities of cables defining a second thickness D3 in a direction substantially parallel to the first thickness TH, such that a cumulative thickness D4 is defined by a combination of the first and second thicknesses TH and D3.

As illustrated in FIG. 1B, the retention housings 100 can define a transverse dimension or thickness D5 (see FIG. 1B) that is extends in the transverse direction from an inner surface 103e of the upper wall 103a and the engagement surface 115. Prior to mounting the retention housings to the substrate, the transverse dimension D5 defined by the retention housings 100 is less than the cumulative transverse dimension D4 defined by the substrate 200 and at least one up to all of the cables 300 individually. Otherwise stated, the assembly 10 defines a first distance between the substrate 200 and the cables 300, and a second distance between the upper wall 103a and the mounting members 108 that is less than the first distance prior to mounting the respective retention housing to the substrate 200. As will now be described, the upper wall 103a may compress the respective cables 300 as the respective retention housing 100 is mounted to the substrate 200, thereby reducing the first distance to substantially equal the second distance.

For instance, in accordance with the illustrated embodiment, as the upper retention housing 100a is mounted to the upper surface 204a of the substrate 200, and the lower retention housing 100b is mounted to the lower surface 204b of the substrate 200, the respective upper walls 103a compress the respective cables 300a and 300b against the corresponding surfaces 204a and 204b of the substrate 200 until the engagement surfaces 115 of the respective heads 114 engage the surface of the substrate 200 that is opposite the surface of the substrate 200 to which the retention housing 100 is mounted, so as to reduce the cumulative transverse dimension D4 defined by the substrate 200 and at least one up to all of the cables 300 individually until the cumulative transverse dimension D4 is substantially equal to the transverse dimension D5 defined by the retention housings 100. In accordance with the illustrated embodiment, when the upper and lower retention housings 100a-b are mounted to the substrate 200, the rear end 102b of the lower retention housing 100b can be substantially aligned with the front end 102a of the upper retention housing 100a along the transverse direction, or longitudinally offset as desired.

Each of the upper and lower retention housings 100a-b can thus be configured to bias at least a portion of each of the respective pluralities of cables 300a-b, for instance the exposed portions 307 of the ground jackets 306, against respective ground elements 214, such that the exposed portions 307 of the ground jackets 306 are placed into electrical communication with the corresponding ones of the ground elements 214, thereby establishing an electrical ground path between each of the first and second pluralities of cables 300a-b and the substrate 200. For example, when at least one or both of the upper and lower retention housings 100a-b are mounted to a substrate 200, the respective upper walls 103a of the at least one or both of the upper and lower retention housings 100a-b can bias the respective ground jackets 306 of each of the respective plurality of cables 300 against a corresponding common ground element 214 of the substrate so as to establish a ground path through each of the ground jackets 306 of the plurality of cables 300 to the substrate 200. It should thus be appreciated that the first and second retention housings 100a-b can be constructed of any suitable material as desired. For instance, the first and second retention housings 100a-b may be fully or partially conductive by constructing housings 100a-b from, or coated them with, a conductive material such as a metal or a conductive plastic, or any suitable lossy material as desired, such as an electrically conductive lossy material. It should be further appreciated that the first and second retention housings 100a-b can alternatively be constructed of, or coated with, any suitable nonconductive material, such as a nonconductive plastic or a nonconductive lossy material.

In accordance with an embodiment, a method of mounting a retention housing 100, 100' onto a substrate 200 can comprise the step of providing or teaching the use of a plurality of cables 300, each cable 300 of the plurality of cables 300 having at least one conductor 302 surrounded by an electrically isolative layer 304, and at least one ground jacket 306 that surrounds the electrically isolative layer 304, and a substrate 200 that includes a common ground element 214 that is supported by a respective surface 204a or 204b of the substrate 200 and at least one contact pad 208 that is supported by the respective surface of the substrate, and a retention housing 100 that includes a housing body 102 that includes a upper wall 103a and a mounting member 108 that extends from the housing body 102. The method can further comprise the step of teaching the step of mounting the plurality of cables 300 to the substrate 200 such that respective conductors 302 of the plurality of cables 300 are in electrical communication with the respective ones of the at least one contact pad 208. The method can further comprise the step of teaching the step of mounting the mounting member 108 to the substrate 200 so as to mount the retention housing 100 to a respective surface 204a or 204b of the substrate 200, wherein the upper wall 103a of the retention housing 100 biases respective ground jackets 306 of each of the plurality of cables 300 against the common ground element 214 so as to establish a ground path through each of the respective ground jackets 306 of the plurality of cables 300 to the substrate 200.

Figure 2:
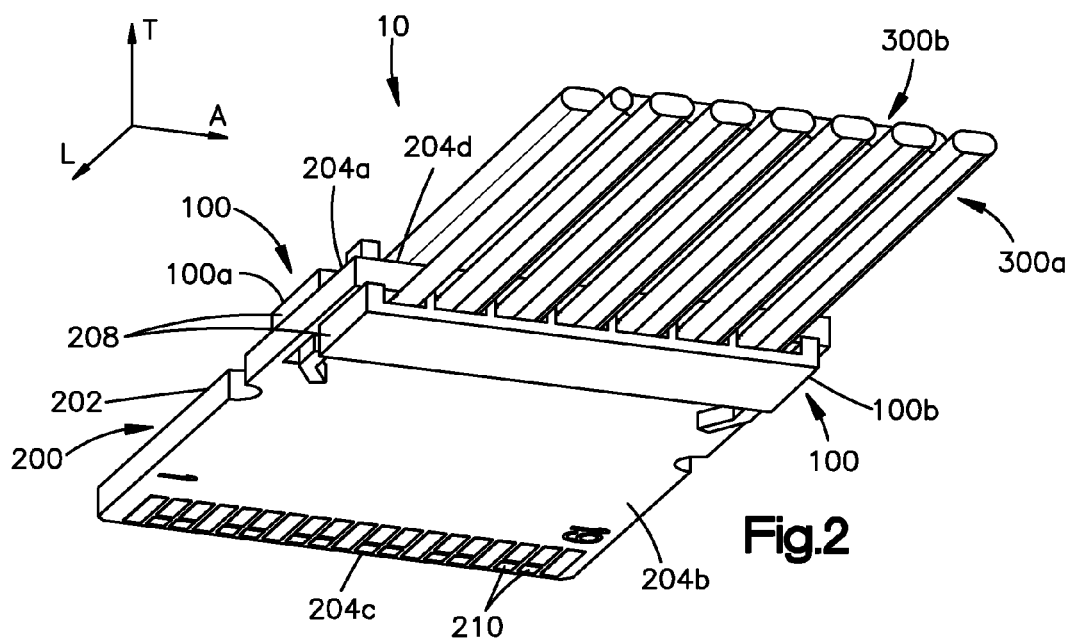
FIG. 2 is a perspective view of a pair of retention housings mounted to a substrate in accordance with an alternative embodiment.

Referring now to FIG. 2, the first and second pluralities of contact pads 212a-b can be positioned at any offset in the longitudinal direction L as desired. For instance, at least one or both of the first and second pluralities of contact pads 212a-b can be positioned closer than illustrated in FIGS. 1C-D, such that the corresponding first and second rows R1 and R2 are likewise spaced closer to one another along the longitudinal direction L than as illustrated in FIG. 1C. Accordingly, when the upper and lower retention housings 100a-b are mounted to the substrate 200, the rear end 102b of the lower retention housing 100b is disposed forward of the front end 102a of the upper retention housing 100a, relative to the front edge 204d of the substrate 200. Furthermore, the posts 110 disposed proximate the rear end 102b of the lower retention housing 100b are disposed between the posts 110 on each side wall 103c-d of the upper retention housing 100a, and the posts 110 disposed proximate the front end 102a of the upper retention housing 100a are disposed between the posts 110 on each side wall 103c-d of the lower retention housing 100b.

In yet another exemplary embodiment, the ground jacket 306 of the cables 300 is configured to be positioned so as to place them in electrical communication with the ground element 214. For example, each ground jacket 306 of the first plurality of cables 300a and the second plurality of cables 300b may be position so as to place them in electrical communication with ground elements 214a and 214b respectively.

Figure 3A:
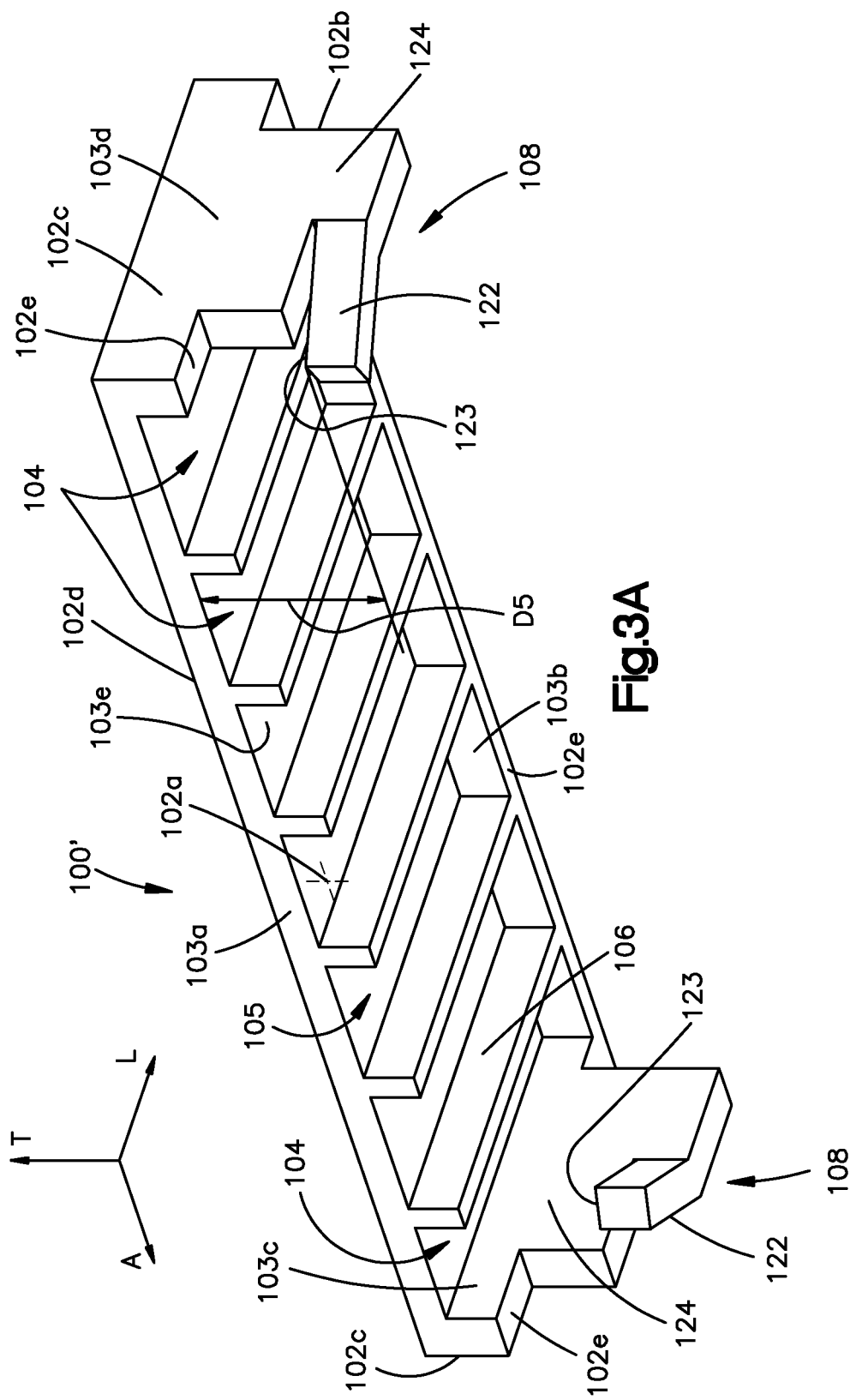
FIG. 3A is perspective view of a retention housing constructed in accordance with an alternative embodiment.
Figure 3B:
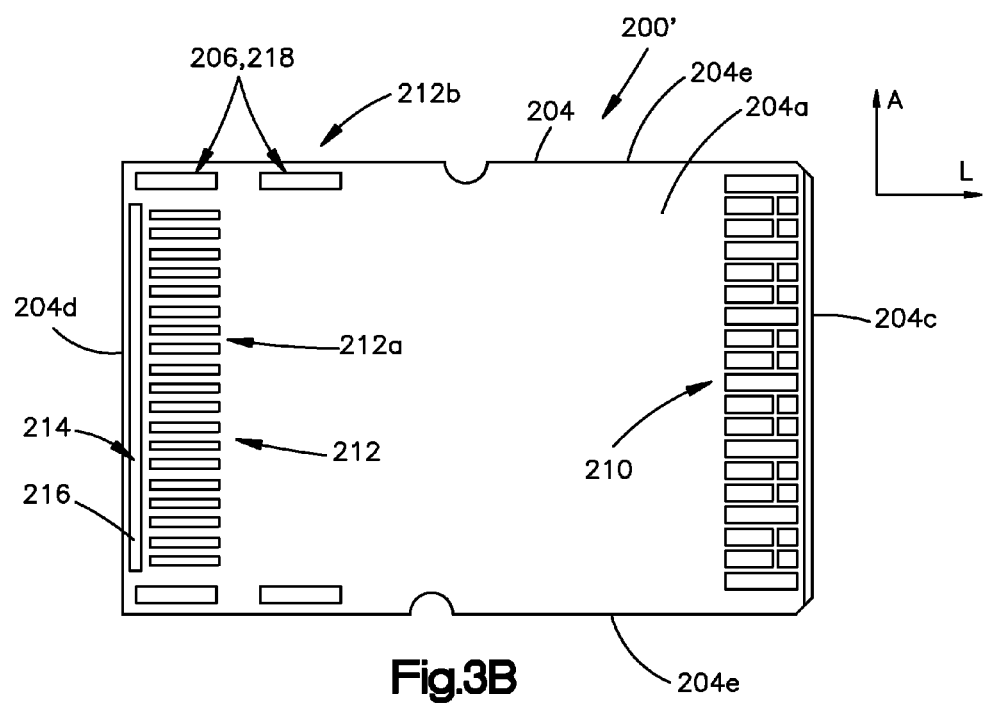
FIG. 3B is a top elevation view of a substrate constructed in accordance with an alternative embodiment.
Figure 3C:
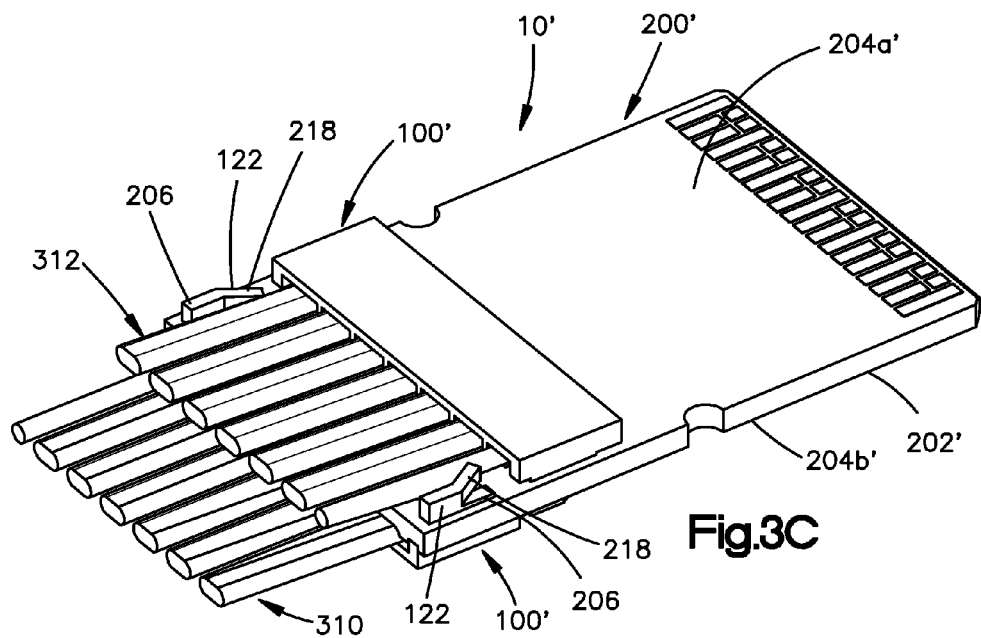
FIG. 3C is a perspective view of a pair of retention housings illustrated in FIG. 3A, the retention housings mounted to opposed sides of a substrate illustrated in FIG. 3B.

Referring now to FIGS. 3A-C, an assembly 10' including a pair of retention housings 100' and a 200' constructed in accordance with an alternative embodiment is illustrated. The electrical assembly 10' is constructed substantially similarly to the assembly 10, but the retention housings 100' and the substrate 200' are constructed with alternative mounting members 108, 206 respectively. In accordance with the illustrated embodiment, the retention housings 100' can include respective pluralities of mounting members 108 in the form of resiliently deflectable arms 122 defined by the distal ends of respective tabs 124 that extend from the inner ends 102e of respective ones of the side walls 103c-d. The tabs 124 can have a height as defined by the inner ends 102e of the side walls 103c-d and the distal ends of the tabs 124 that is substantially equal to the thickness of the substrate 200' as defined by the upper and lower surfaces 204a', 204b'. The arms 122 can be configured to be inwardly angled with respect to the tabs 124 when the arms 122 are in respective relaxed positions. The arms 122 can be configured to be biased outwardly, and thereby operated from the relaxed positions to respective insertion positions wherein the cross sectional profile of each arm 122 along a plane defined by the longitudinal and lateral directions is substantially aligned and coincident with that of a corresponding one of the tabs 124. In other words, with the arms 122 operated to the insertion positions, the arms 122 and the tabs 124 exhibit a unitary cross sectional profile. The substrate 200' can define corresponding pairs of mounting members 206, such as apertures that extend there through in the form of slots 218, the slots 218 sized to receive the arms 122 and the tabs 124 therein in substantially a clearance fit.

When a retention housing 100' is mounted to a respective surface of the substrate 200', for example the upper surface 204a', the arms 122 of the retention housing 100' can be operated from the relaxed to the insertion positions such that the arms 122 and tabs 124 can be inserted into the slots 218. When the arms 122 advance through the slots 218 to the lower surface 204b' of the substrate 200', arms 122 can resiliently snap back to their original relaxed positions, such that engagement surfaces 123 of the arms 122 come to rest against the lower surface 204b' of the substrate 200', thereby placing the arms 122 into engagement with the substrate 200', and securing the retention housing 100' in a mounted position relative to the substrate 200'. It should be appreciated that the assemblies 10, 10' are not limited to the illustrated mounting members 108, 206, and that the retention housings 100, 100' and/or the substrates 200 and 200' can alternatively be constructed with any other suitable mounting members as desired.

Although the cable retention housing has been described herein with reference to preferred embodiments and/or preferred methods, it should be understood that the words which have been used herein are words of description and illustration, rather than words of limitation, and that the scope of the instant disclosure is not intended to be limited to those particulars, but rather is meant to extend to all structures, methods, and/or uses of the herein described cable retention housing. Those skilled in the relevant art, having the benefit of the teachings of this specification, may effect numerous modifications to the cable retention housing as described herein, and changes may be made without departing from the scope and spirit of the instant disclosure, for instance as recited in the appended claims.

What is claimed:

1. An electrical assembly comprising:
    a substrate that carries a plurality of signal contact pads and at least one ground contact pad disposed between ones of the signal contact pads;
    a plurality of cables, each having a pair of electrical signal conductors and an electrical ground jacket that surrounds the pair of electrical signal conductors, each of the electrical signal conductors mounted to respective adjacent signal contact pads; and
    a retention housing configured to be mounted to the substrate, the retention housing including:
        a base defining an inner surface configured to face the substrate;
        a rear wall extending from the inner surface toward the substrate; and
        a plurality of walls that define a corresponding plurality of cavities, each wall extending substantially from the inner surface toward the substrate, and each wall defining a distal end attached to the rear wall, and a proximal end opposite the distal end,
    wherein:
        each of the walls is spaced from an adjacent wall such that the wall, the adjacent wall, the rear wall, and the base at least partially define a respective one of the cavities, each cavity having a first opening between the proximal ends of the wall and the adjacent wall opposite the rear wall, and a second opening between the wall and the adjacent wall opposite the base, the second opening being closed by the substrate, and each cavity being sized to receive the pair of signal conductors of a select one of the cables, such that the select one of the cables extends out the first opening, and wherein the retention housing is configured such that the inner surface of the base compresses the ground jacket of each of one or more of the cables against a planar surface of the substrate when the retention housing is mounted to the substrate and when the one or more cables are received in a respective one of the plurality of cavities, and
        the base includes a front end spaced from the rear wall in the longitudinal direction, and the inner surface is planar as it extends from the rear wall to the front end.

2. The electrical assembly as recited in claim 1, wherein one or more of the plurality of walls contacts a ground contact pad of the at least one ground contact pad when the retention housing is mounted to the substrate.

3. The electrical assembly as recited in claim 2, wherein the retention housing is at least partially electrically conducive so as to electrically connect ground pads of the at least one ground contact pad to each other.

4. The electrical assembly as recited in claim 3, wherein at least the inner surface is electrically conductive.

5. The electrical assembly as recited in claim 1, wherein at least a plurality of the cables further comprises a respective drain wire that is mounted to a corresponding one of the at least one ground contact pad.

6. An electrical assembly comprising:
    a substrate that carries a plurality of signal contact pads and at least one ground contact pad disposed between ones of the signal contact pads;
    a plurality of cables, each having a pair of electrical signal conductors and an electrical ground jacket that surrounds the pair of electrical signal conductors, each of the electrical signal conductors mounted to respective adjacent signal contact pads; and a retention housing configured to be mounted to the substrate, the retention housing including:
- a base defining an inner surface configured to face the substrate;
- a rear wall extending from the inner surface toward the substrate; and
- a plurality of walls that define a corresponding plurality of cavities, each wall extending substantially from the inner surface toward the substrate, and each wall defining a distal end attached to the rear wall, and a proximal end opposite the distal end, wherein:
each of the walls is spaced from an adjacent wall such that the wall, the adjacent wall, the rear wall, and the base at least partially define a respective one of the cavities, each cavity having a first opening between the proximal ends of the wall and the adjacent wall opposite the rear wall, and a second opening between the wall and the adjacent wall opposite the base, the second opening being closed by the substrate, and each cavity being sized to receive the pair of signal conductors of a select one of the cables, such that the select one of the cables extends out the first opening, and wherein the retention housing is configured such that the inner surface of the base compresses the ground jacket of each of one or more of the cables against a planar surface of the substrate when the retention housing is mounted to the substrate and when the one or more cables are received in a respective one of the plurality of cavities, and one or more of the plurality of walls is configured to be placed between a ground contact pad and a signal contact pad.

7. The electrical assembly as recited in claim 1, wherein the substrate further carries an electrically conductive common ground member that contacts the ground jacket of at least a pair of the cables so as to electrically common the ground jackets of the pair of cables.

8. An electrical assembly comprising:
a substantially planar substrate that defines first and second opposed substrate surfaces that each carry electrical contact pads;
a first cable electrically attached to the electrical contact pads carried by the first substrate surface, and a second cable electrically attached to the electrical contact pads carried by the second substrate surface;
a first retention housing electrically attached to the first substrate surface, and a second retention housing electrically attached to the second substrate surface, wherein each of the first and second retention housings include:
a base defining an inner surface configured to face the substrate;
a first wall extending substantially from the inner surface along a transverse direction toward the substrate, the first wall defining a distal end and a proximal end spaced from the distal end along a longitudinal direction that is substantially perpendicular to the transverse direction;
a second wall extending from the inner surface toward the substrate, the second wall spaced from the first wall along a lateral direction that is substantially perpendicular to both the longitudinal direction and the transverse direction,
wherein the first and second walls and the base at least partially define a cavity, wherein at least a portion of the first and second cables are disposed in into the cavities of the first and second retention housings, respectively, wherein such that the first and second retention housings are attached to the substrate at respective mounting locations, and wherein at least one of the mounting locations of the first retention housing is offset with respect to all of the mounting locations of the second retention housing in at least one of the lateral and longitudinal directions.

9. A method of mounting a first retention housing and a second retention housing onto a substrate, the method comprising the steps of:
providing or teaching the provision of a substantially planar substrate that defines first and second opposed substrate surfaces that each carry electrical contact pads;
providing or teaching electrical attachment of a first cable to the electrical contact pads carried by the first substrate surface, and attachment of a second cable to the electrical contact pads carried by the second substrate surface;
providing or teaching attachment of a first retention housing to the first substrate surface, and attachment of a second retention housing to the second substrate surface, wherein each of the first and second retention housings include:
a base defining an inner surface configured to face the substrate;
a first wall extending substantially from the inner surface along a transverse direction toward the substrate, the first wall defining a distal end and a proximal end spaced from the distal end along a longitudinal direction that is substantially perpendicular to the transverse direction;
a second wall extending from the inner surface toward the substrate, the second wall spaced from the first wall along a lateral direction that is substantially perpendicular to both the longitudinal direction and the transverse direction,
wherein the first and second walls and the base at least partially define a cavity, wherein at least a portion of the first and second cables are disposed in the cavities of the first and second retention housings, respectively, wherein the first and second retention housings are attached to the substrate at respective mounting locations, and wherein at least one of the mounting locations of the first retention housing is offset with respect to all of the mounting locations of the second retention housing in at least one of the lateral and longitudinal directions.

10. The electrical assembly of claim 1, wherein the plurality of signal contact pads comprises a plurality of pairs of signal contact pads, and when the retention housing is mounted to the substrate, a pair of the signal contact pads is disposed in one of the plurality of cavities.

11. A retention housing configured to be mounted onto a substrate, the retention housing comprising:
a base defining a front end and a rear end spaced from the front end in a longitudinal direction, the base further defining an inner surface configured to face the substrate, the inner surface being planar as it extends from the rear end to the front end;
a rear wall extending from the inner surface at the rear end and along a transverse direction that is perpendicular to the longitudinal direction, the rear wall elongate along a lateral direction that is substantially perpendicular to both the longitudinal and transverse directions;

a plurality of walls that define a corresponding plurality of cavities, each wall extending substantially along the transverse direction from the inner surface, and defining a distal end attached to the rear wall, and a proximal end spaced from the distal end along the longitudinal direction, and each wall is spaced from an adjacent one of the walls such that the wall, the adjacent wall, the rear wall, and the base at least partially define a respective one of the cavities, each cavity having a first opening between the proximal ends of the wall and the adjacent wall opposite the rear wall, and a second opening between the wall and the adjacent wall opposite the base, and each cavity being sized to receive a cable including a pair of differential signal conductors that are mounted onto the substrate, wherein when the retention housing is mounted to the substrate, the pair of differential signal conductors extends out the first opening, and the substrate substantially closes the second opening.

12. The retention housing of claim 11, wherein each wall is spaced from an immediately adjacent one of the walls with no intervening walls therebetween such that the wall, the immediately adjacent wall, the rear wall, and the base at least partially define a respective one of the cavities.

13. The retention housing of claim 11, wherein the inner surface is electrically conductive.

14. The electrical assembly of claim 8, wherein the inner surface is electrically conductive.

15. The electrical assembly of claim 14, wherein, for each of the first and second retention housings, the first and second walls define respective surfaces that face each other and at least partially define the cavity, wherein the respective surfaces are electrically conductive.

16. The electrical assembly of claim 8, wherein each retention housing of the first and second retention housings is configured such that the inner surface of the retention housing compresses a ground jacket of one of the first and second cables against a planar surface of the substrate when the retention housing is mounted to the substrate and when the one of the first and second cables is received in one of the cavities of the retention housing.

17. The electrical assembly as recited in claim 8, wherein, for each retention housing of the first and second retention housings, the base of each of the retention housing includes a front end spaced from the rear wall in the longitudinal direction, and the inner surface is planar as it extends from the rear wall to the front end.

* * * * *